United States Patent [19]
Igel et al.

[11] Patent Number: 5,902,120
[45] Date of Patent: May 11, 1999

[54] PROCESS FOR PRODUCING SPATIALLY PATTERNED COMPONENTS

[75] Inventors: Guenter Igel, Teningen; Martin Mall, Freiburg, both of Germany

[73] Assignee: Micronas Intermetall GmbH, Freiburg, Germany

[21] Appl. No.: 09/041,805

[22] Filed: Mar. 13, 1998

[30] Foreign Application Priority Data

Mar. 13, 1997 [DE] Germany ............... 197 10 375

[51] Int. Cl.$^6$ .................................. H01L 21/302
[52] U.S. Cl. ................. 438/113; 438/122; 438/415; 257/713; 257/717
[58] Field of Search ................... 438/122, 415, 438/735, 738, 924, 113, FOR 148, FOR 497; 257/713, 717

[56] References Cited

U.S. PATENT DOCUMENTS

| | | |
|---|---|---|
| 3,897,627 | 8/1975 | Klatskin . |
| 3,979,820 | 9/1976 | Anthony et al. . |
| 3,988,762 | 10/1976 | Cline et al. . |
| 4,063,966 | 12/1977 | Anthony et al. . |
| 4,325,182 | 4/1982 | Tefft et al. . |
| 4,438,556 | 3/1984 | Komatsu et al. . |
| 4,601,778 | 7/1986 | Robb . |
| 5,185,295 | 2/1993 | Goto et al. . |
| 5,266,528 | 11/1993 | Yamada . |
| 5,614,445 | 3/1997 | Hirabayashi . |
| 5,724,228 | 3/1998 | Lee . |
| 5,734,553 | 3/1998 | Hong . |
| 5,789,307 | 2/1997 | Igel et al. . |

Primary Examiner—Charles Bowers
Assistant Examiner—Martin Sulsky
Attorney, Agent, or Firm—Arthur L. Plevy

[57] ABSTRACT

A process is disclosed for producing spatially patterned components from a body. On the backside of the body, a retardation layer with openings is provided for retarding a removal of the material of the body, and areas of migration-capable material are deposited. The body is subjected to a thermal migration process to form migration regions. Then, in a single material removal step, the components are separated from the body and the migration regions are exposed.

17 Claims, 2 Drawing Sheets

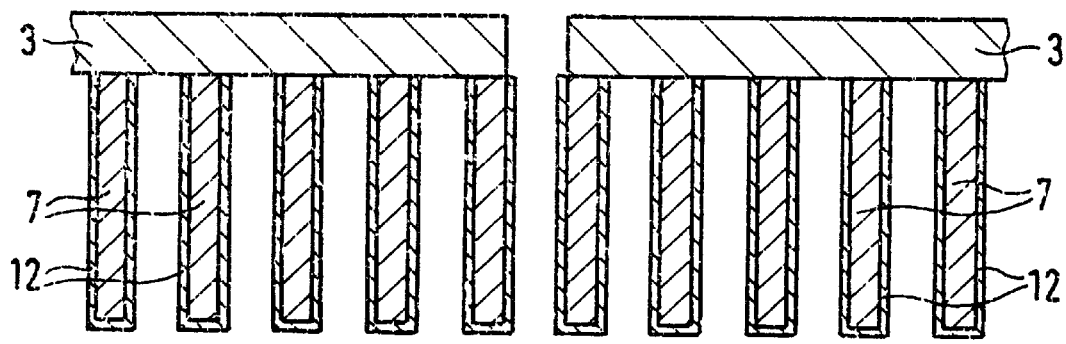
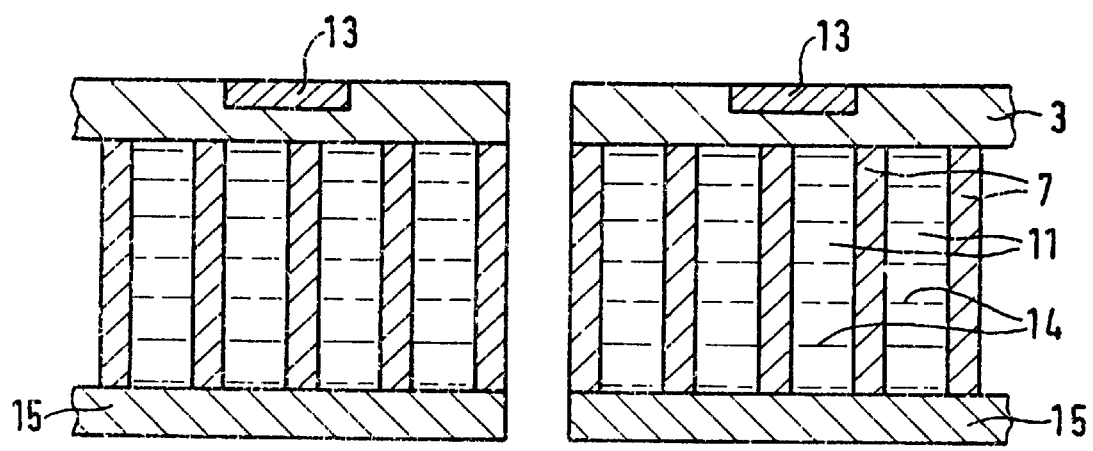

PROCESS FOR PRODUCING SPATIALLY PATTERNED COMPONENTS

FIELD OF THE INVENTION

This invention relates to a process for producing spatially patterned components from a body.

BACKGROUND OF THE INVENTION

One technical area in which components are produced from a body is semiconductor technology, where semiconductor wafers are separated into individual electronic devices.

Such a process for separating a wafer into chips is disclosed in DE 43 17 721. The wafer has an SOI (silicon-on-insulator) layer. Between the chips, moats are etched down to the insulator layer. Then, spacers are formed for passivating silicon-oxide layers of the chips, and finally, the chips are separated by etching away the insulator layer.

German Patent Application No. 195 38 634.5, which was not published prior to the filing date of the present application, discloses another process for separating a semiconductor wafer into electronic devices. In this process, the electronic devices are separated by removing material in separation regions of the semiconductor wafer. In a wafer area to be thinned, a retardation layer is provided which retards the removal of material and has openings in the separation regions. With this process, even very thin electronic devices can be readily separated from a relatively thick semiconductor wafer as is commonly used for stability reasons. The thickness of the semiconductor wafer is reduced simultaneously with the separation process. The devices are separated simultaneously by removing the material in the separation regions of the semiconductor wafer. The material of the retardation layer is chosen to slow down the removal of the material, so that the thickness of the body is reduced more slowly than the device separation takes place.

From Schade, Halbleitertechnologie Band 2, Verlag Technik, Berlin 1983, page 21 et seq., it is known to form patterns of migration-capable material in a semiconductor. A migration-capable material, such as aluminum, is deposited on the semiconductor by thin-film techniques. By a migration process in which a given temperature gradient is applied to the semiconductor wafer, the material is caused to migrate from the film along the temperature gradient into the semiconductor. With this process, both abrupt pn junctions and enriched regions as well as interconnections through the semiconductor can be formed.

For various applications, it may be desirable to produce spatially patterned components. In semiconductor technology, such components can be used as heatsinks, for example. They can be fabricated separately and be attached to electronic devices. However, it is complicated and costly to produce suitably patterned components, such as microheatsinks, and connect them with electronic devices.

It is also known in practice to produce electronic devices with a cooling system by patterning the backside of the wafer by forming saw lines therein so as to enlarge the wafer back surface. This process has the disadvantage that because of the sawing, the wafer becomes mechanically unstable, and that as a result of the patterning, the wafer may become warped.

Accordingly, it is greatly desired to obtain a simple process for producing spatially patterned components without the above-mentioned disadvantages.

SUMMARY OF THE INVENTION

This object is attained by a process for producing spatially patterned components from a body comprising the steps of providing on the backside of the body a retardation layer for retarding a removal of the material of the body, the retardation layer having openings in separation regions for separating the components, depositing a layer of migration-capable material on the backside of the body and patterning the layer in such a way as to form at least one area of the migration-capable material per component on the backside of the body. The body is then subjected to a migration process whose parameters are chosen so that part of the migration-capable material will reach a predetermined area near the front side of the body, whereby migration regions are formed in the body and then, in a single material removal step, separating the components from the body and baring the migration regions or the material lying between the migration regions.

With the process according to the invention, components are formed which are patterned by the bared migration regions. These components can be separated from the body in a single material removal step. In this step, the removal of the material in the migration regions and in areas where the retardation layer is present is retarded.

Thus, the material in the separation regions between the components is removed. Depending on the material of the migration regions, i.e., on whether this material has a lower or higher removal rate than the material of the body, the material between the migration regions or the material in the migration regions is removed simultaneously. Thus, components of a predetermined thickness are obtained which additionally have a pattern determined by the migration regions.

Since the separation and patterning of the components are performed in one material removal step, no mechanical stresses as are caused by machining occur in the wafer. Furthermore, the stability of the wafer during the fabrication process is not reduced.

Preferably, the removal of the material of the body is done by etching, particularly by plasma etching. The migration-capable material advantageously has a lower removal rate than the material of the body. Then, after separation of the components, the migration regions are left behind and form a spatial pattern of the components. The material of the migration layer may be a metal, particularly aluminum.

In a preferred embodiment, the body is a semiconductor wafer on whose front side active regions are formed, with the components produced being electronic devices. In that case, electronic devices with a spatial pattern are produced. This is advantageous, for example, if electronic devices have to be cooled, because the electronic devices thus produced already have a micro-cooling system which need not be connected with the electronic devices in a separate step. In further applications, the migration regions may be used as electric terminals or as capacitor electrodes.

A material different from the material of the body may be introduced into the spaces between the migration regions associated with a component. It may serve, for example, as a dielectric between capacitor electrodes or as a further material for dissipating heat between cooling elements.

Furthermore, the bared migration regions may be provided with a coating. The material of the coating is also chosen according to the application of the components. It is also possible to provide the backside of the bared migration regions with a cover associated with the respective component. This is advantageous, for example, if a liquid or gaseous material is introduced into the spaces between the migration regions and should not leak or escape. In the case of semiconductor components, the cover may be implemented by attaching a second semiconductor wafer to the backside of the wafer in which the components are formed.

BRIEF DESCRIPTION OF DRAWINGS

The invention will now be explained in more detail with reference to the accompanying drawings, in which:

FIG. 4 shows an alternative embodiment of a component fabricated with the process according to the invention; and FIG. 5 shows a further component fabricated with the process according to the present invention.

DETAILED DESCRIPTION OF THE INVENTION

Figure 1:
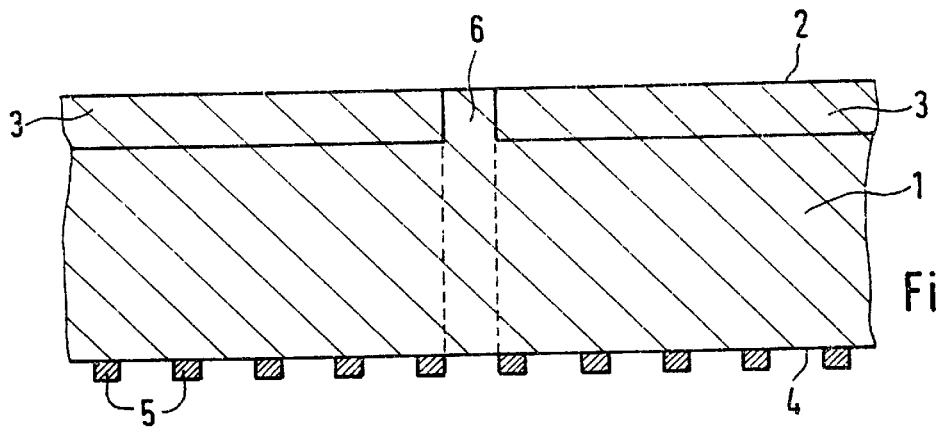
FIGS. 1 to 3 show a spatially patterned component fabricated via the process in accordance with the present invention.

FIG. 1 shows a section through a part of a body 1, which corresponds to a semiconductor wafer. On the front side 2 of the semiconductor wafer, main regions 3 of the components to be produced are shown. On the backside 4 of the semiconductor wafer, a layer of migration-capable material was deposited and patterned in such a manner that for each component to be produced, several areas 5 of the migration-capable material were formed on the backside 4 of the wafer. Between the components to be produced, a separation region 6 for separating the components is defined. The semiconductor wafer may be made of silicon, and the areas 5 of migration-capable material may be of aluminum. In this condition, the semiconductor wafer is subjected to a thermal migration process whose parameters, particularly temperature gradient and time, are chosen so that the migration-capable material will migrate into the semiconductor wafer until part of the migration-capable material reaches a predetermined area near the front side 2 of the body 1. The predetermined area is defined here by the main region 3 of the components. Migration regions 7 are formed which, in this embodiment, have a rodlike structure.

Figure 2:
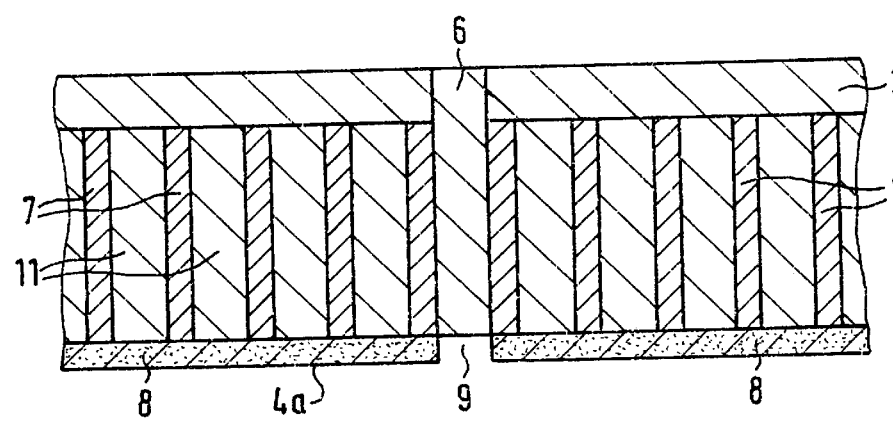

Then, a retardation layer 8 for retarding a removal of the material of the semiconductor wafer and having openings 9 in the separation regions 6 of the semiconductor wafer is deposited on the backside of the semiconductor wafer, as shown in FIG. 2. After that, the semiconductor wafer is etched starting from the coated backside 4a. Preferably, a plasma etching process is used. The thickness and the material of the retardation layer 8 are chosen so that in areas where the retardation layer 8 has no opening 9, the local etch rate is changed so that the main regions 3 of the components 10 are preserved while the material of the semiconductor wafer is removed from the separation regions 6. The retardation layer 8 may be made of silicon oxide. During the etching process, the migration regions 7 act as highly effective retardation layers, so that they are essentially unaffected by the etching process. By the etching process, the components 10 are separated from the semiconductor wafer and simultaneously patterned.

Figure 3:
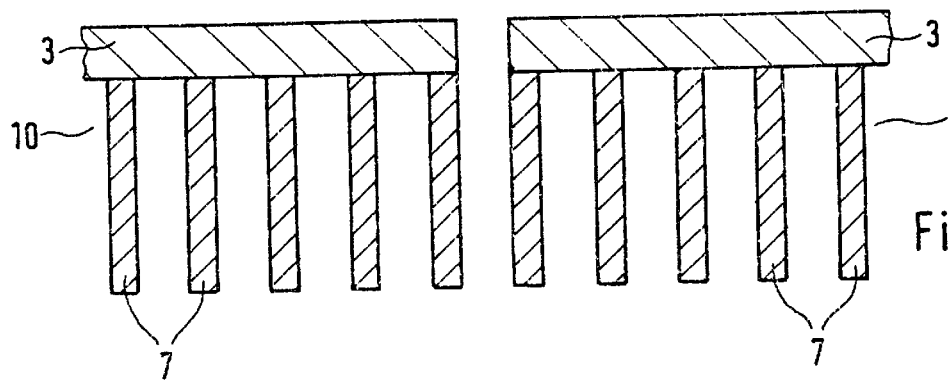

FIG. 3 shows the spatially patterned components 10 after they have been separated from the semiconductor wafer by the etching process. They consist of the main regions 3 and the migration regions 7. The components 10 can be used as heatsinks, for example. They can be attached to electronic devices. However, it is also possible to form active regions in the semiconductor wafer in the main regions 3, so that these devices themselves serve as electronic devices which have already been provided with migration regions 7, which can be used as a heatsink, for example.

Various modifications may be made in the embodiment of the invention described. For example, first the retardation layer 8 may be deposited on the backside 4 of the semiconductor wafer, and then the areas 5 of migration-capable material may be formed on the retardation layer 8. The material and size of the areas 5 of migration-capable material must then be chosen so that the material can also migrate through the retardation layer 8 by a thermal migration process. The migration-capable material may also be chosen to have a higher etch rate than the material of the body. In that case, the intermediate regions 11 between the migration regions 7 would not be affected by the etching process.

FIG. 4 shows spatially patterned components which were produced by the process described in connection with FIGS. 1 to 3. In this embodiment, the bared migration regions 7 were provided with a coating 12. The coating 12 may be chosen so as to reinforce the bared migration regions 7. It may result in better thermal conduction.

FIG. 5 shows an embodiment of components 10 in which active regions 13 were formed in the main region 3. The components 10 are thus electronic devices. The active regions 13 are commonly formed prior to the deposition of the areas 5 of migration-capable material and prior to the deposition of the retardation layer 8 on the backside of the semiconductor wafer. After the separation of the components 10 by the method described in connection with FIGS. 1 to 3, a material 14 different from the materials of the body and the migration regions 7 is introduced into the spaces 11 between the migration regions 7. The backside of the bared migration regions 7 is provided with a cover 15 associated with the respective component 10. The cover 15 may be formed by attaching a further semiconductor wafer. The material introduced into the spaces 11 between the migration regions 7 may be solid, liquid, or gaseous. The cover 15 may also be applied to the backside of the migration regions 7 prior to the introduction of the material 14 into the spaces between the migration regions. This is particularly appropriate if the material 14 is liquid or gaseous. The material 14 may serve to improve heat dissipation. The migration regions 7 may also serve as capacitor electrodes, in which case the material 14 introduced into the spaces 11 acts as a dielectric.

While the invention has been particularly shown and described with reference to preferred embodiments thereof, it will be understood by those skilled in the art that changes in form and details may be made therein without departing from the spirit and scope of the present invention.

What is claimed is:

1. A process for producing spatially patterned components from a body, comprising the steps of:

providing on the backside of the body a retardation layer for retarding a removal of the material of the body, said retardation layer having openings in separation regions for separating the components;

depositing a layer of migration-capable material on the backside of the body and patterning said layer in such a way as to form at least one area of the migration-capable material per component on the backside of the body;

subjecting the body to a migration process whose parameters are chosen so that part of the migration-capable material will reach a predetermined area near the front side of the body, wherein migration regions are formed in the body; and in a single material removal step, separating the components from the body and baring the migration regions or the material lying between the migration regions.

2. The process as claimed in claim 1, wherein the step of removal of the material of the body comprises etching.

3. A process as claimed in claim 1, wherein the migration-capable material used is a metal.

4. A process as claimed in claim 1, wherein the body is a semiconductor wafer, said process further comprising forming active regions on the front side of said body to produce said components of electronic devices.

5. A process as claimed in claim 1, further comprising introducing a material different from the material of the body into the spaces between the migration regions associated with a component.

6. A process as claimed in claim 1, further comprising providing the bared migration regions with a coating.

7. A process as claimed in claim 1, further comprising providing the backside of the bared migration regions with a cover associated with the respective component.

8. A process according to claim 2, wherein the step of etching further comprises plasma etching.

9. A method for producing spatially patterned components from a body, comprising the steps of:

providing on the backside of the body a retardation layer for retarding a removal of the material of the body, said retardation layer having openings in separation regions for separating the components;

depositing a layer of migration-capable material on the backside of the body and patterning said layer in such a way as to form at least one area of the migration-capable material per component on the backside of the body;

subjecting the body to a migration process whose parameters are chosen so that part of the migration-capable material will reach a predetermined area near the front side of the body, wherein migration regions are formed in the body; and in a single material removal step, separating the components from the body and baring the migration regions or the material lying between the migration regions to form a heat sink.

10. A method for producing spatially patterned components from a semiconductor body, said method comprising the steps of:

forming at least one active region on a front side of said body to enable formation of at least one electronic device;

depositing a layer of migration-capable material on a backside of said body and patterning said layer in such a way as to form at least one area of the migration-capable material per component on said backside of said body, said backside of said body being oppositely disposed from said front side;

forming migration regions in said body by subjecting said body to a migration process wherein said migration-capable material will reach a predetermined area near said front side of the body;

forming a retardation layer on said backside of said body, said retardation layer for retarding removal of the material of said body and having openings in separation regions for separating said components; and, in a single material removal step, separating said components from said body and baring the migration regions or the material lying between the migration regions.

11. The process as claimed in claim 10, wherein the single material removal step includes etching.

12. The process as claimed in claim 10, wherein the migration-capable material used is a metal.

13. The process as claimed in claim 10, wherein the body is a semiconductor wafer, said process further comprising forming active regions on the front side of said body to produce said components of electronic devices.

14. The process as claimed in claim 10, further comprising introducing a material different from the material of the body into the spaces between the migration regions associated with a component.

15. The process as claimed in claim 10, further comprising providing the bared migration regions with a coating.

16. The process as claimed in claim 10, further comprising providing the backside of the bared migration regions with a cover associated with the respective component.

17. The process according to claim 11, wherein the step of etching further comprises plasma etching.

* * * * *